United States Patent
Johnston

(12) 
(10) Patent No.: US 6,731,164 B2
(45) Date of Patent: May 4, 2004

(54) CAPACITOR CURRENT MULTIPLIER CAPACITIVE FEEDBACK CIRCUIT

(75) Inventor: Robert James Johnston, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/040,023

(22) Filed: Jan. 3, 2002

(65) Prior Publication Data

US 2003/0122617 A1 Jul. 3, 2003

(51) Int. Cl.[7] .............................................. H03F 1/36
(52) U.S. Cl. .................. 330/85; 330/109; 330/288; 327/427; 327/562; 327/590
(58) Field of Search .................. 330/85, 109, 288; 327/427, 562, 590

(56) References Cited

U.S. PATENT DOCUMENTS

| | | | |
|---|---|---|---|
| 4,302,718 A | * 11/1981 | Schade, Jr. | 330/288 |
| 5,926,651 A | 7/1999 | Johnston et al. | 395/872 |
| 6,157,223 A | 12/2000 | Blake | 327/108 |

FOREIGN PATENT DOCUMENTS

JP 404213210 * 8/1992

OTHER PUBLICATIONS

Hill et al. "Single–amplifier integrator–based low power CMOS filter for video frequency applications" IEEE International Symposium on Circuits & Systems vol. 1 2002 pp 517–520.*

Intel Corporation, "Design Guide for a Low Speed Buffer for the Universal Serial Bus" Dec., 1996, 29 pages.

* cited by examiner

Primary Examiner—Michael B Shingleton
(74) Attorney, Agent, or Firm—Blakely, Sokoloff, Taylor & Zafman LLP

(57) ABSTRACT

Various methods and apparatuses that multiply the effects of feedback current on an amplifier. In an embodiment, a buffer circuit controls the transition rate on an output pad of the buffer circuit. An amplifier has an input terminal and an output terminal. The output terminal couples to the output pad. A feedback component couples feedback current from the output pad to the input terminal. A current mirror multiplies the effects of the feedback current on the input terminal without increasing the feedback current through the feedback component.

22 Claims, 4 Drawing Sheets

US 6,731,164 B2

CAPACITOR CURRENT MULTIPLIER CAPACITIVE FEEDBACK CIRCUIT

FIELD OF THE INVENTION

The present invention relates generally to output buffer design for integrated circuits, and more particularly an aspect of the invention relates to capacitive feedback circuits in output buffers for the control of transition rates.

BACKGROUND OF THE INVENTION

Integrated circuits (ICs) are typically capable of operating internally at high speeds because the output loading of circuit stages, due to the parasitic resistances and capacitances inherent in the transistor and interconnect structures, is small. This tends to obviate the need for the use of complex internal buffer circuits. However, when signals must be communicated between the IC and external components, the magnitude of the output loading increases dramatically. Special buffer circuits are often used to communicate signals from inside to outside the IC in view of the heavy output loading. FIG. 1 shows a block level diagram of a prior art output buffer circuit configuration.

The data is sent to an output pad through a pre-driver circuit and either a pull up driver or pull down driver. In addition to being able to drive large loads, output buffers in electronic systems are also sometimes required to provide slew rate controlled signal transitions. Control over the slew rate or transition rate in Universal Serial Bus low speed output circuit applications is especially important because the wires connecting devices such as mouses, keyboards, etc. are typically unshielded. Transition rates with a high rate of change generate electromagnetic interference. The generated electromagnetic interference may distort, for example television reception, radio reception. Presently, output buffers designed to meet given slew rate specifications that minimize generate electromagnetic interference use a relatively large value feedback capacitor to implement slew rate control.

FIG. 2 shows a block diagram of an output buffer having an output stage, a pull-up pre-driver stage, a pull-down pre-driver stage and capacitively coupled feedback to both pull-up and pull-down pre-drivers. Unfortunately, large value capacitors consume correspondingly large amounts of chip area. Larger chip area leads to higher manufacturing costs because yield is closely related to chip area.

In a previously used technique, the output buffer for a USB output circuit requires a capacitor having a large capacitance value in order to pass enough current to achieve a desired edge rate. Transition rate is the charging potential or in other words rate of the change of voltage over time at a particular output. Transition rate is can be stated mathematically as dV/dT. The current through a capacitor can be calculated in accordance with the following equation, Ic=C*dV/dT. Capacitor current equals the capacitance value times the transition rate. Typically, transition rate may also be referred to as slew rate.

BRIEF DESCRIPTION OF THE DRAWINGS

The drawings refer to the invention in which.

Figure 1:
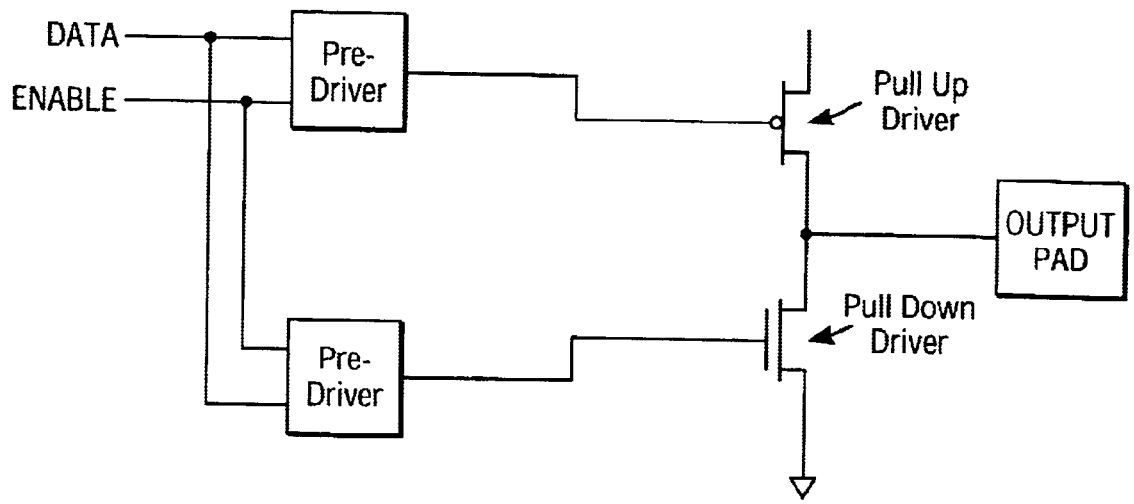
FIG. 1 illustrates a diagram of a prior art output buffer with pre-driver circuits.
Figure 2:
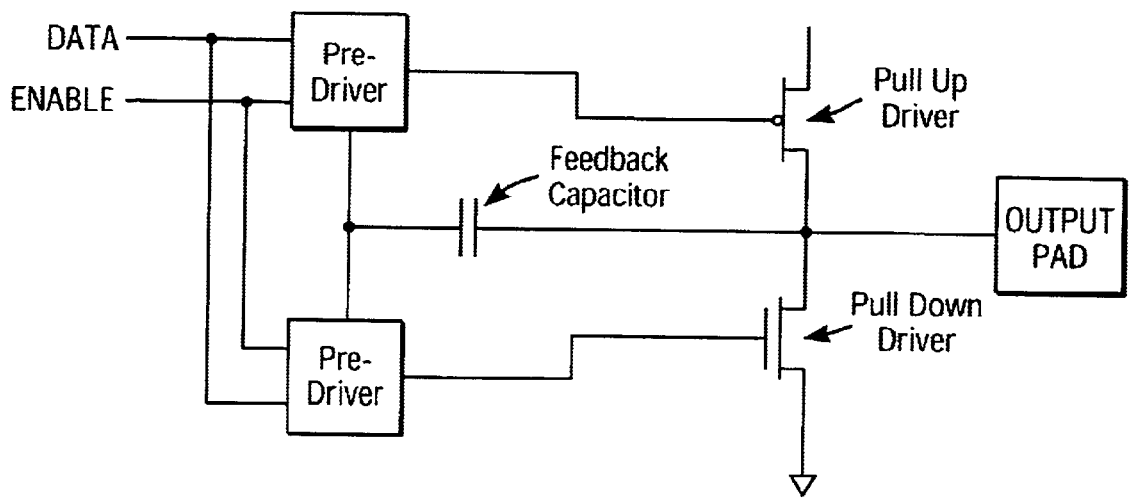
FIG. 2 illustrates a block diagram of an output buffer having capacitivly coupled feedback from the final output stage to the pull-up and pull-down pre-drivers.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific data signals, named component blocks, circuit diagrams, etc., in order to provide a thorough understanding of the present invention. It will be apparent, however, to one skilled in the art that the present invention may be practiced without these specific details. In other instances, well known components or methods have not been described in detail but rather in a block diagram in order to avoid unnecessarily obscuring the present invention. Thus, the specific details set forth are merely exemplary. The specific details may be varied from and still be contemplated to be within the spirit and scope of the present invention. The term coupled is defined as meaning electrically connected either directly or indirectly.

In general, a current mirror may be used in an electronic circuit to reduce the physical size of a capacitor but a USB circuit will be used as an exemplary circuit to illustrate aspects of the invention. An embodiment of a current mirror may be utilized in a capacitive feedback circuit configuration that controls the slew rate of signal transitions while reducing the magnitude of capacitance used to achieve slew rate control. Embodiments may include a current mirror possessing a given gain/multiplication factor coupled between a feedback capacitor and a pre-driver circuit. This configuration multiplies the effect of the feedback capacitor, thus allowing a smaller, less expensive, capacitor to do the work of a larger capacitor. In an embodiment, different multiplication factors may be used for the pull-up and the pull-down pre-drivers.

Figure 3:
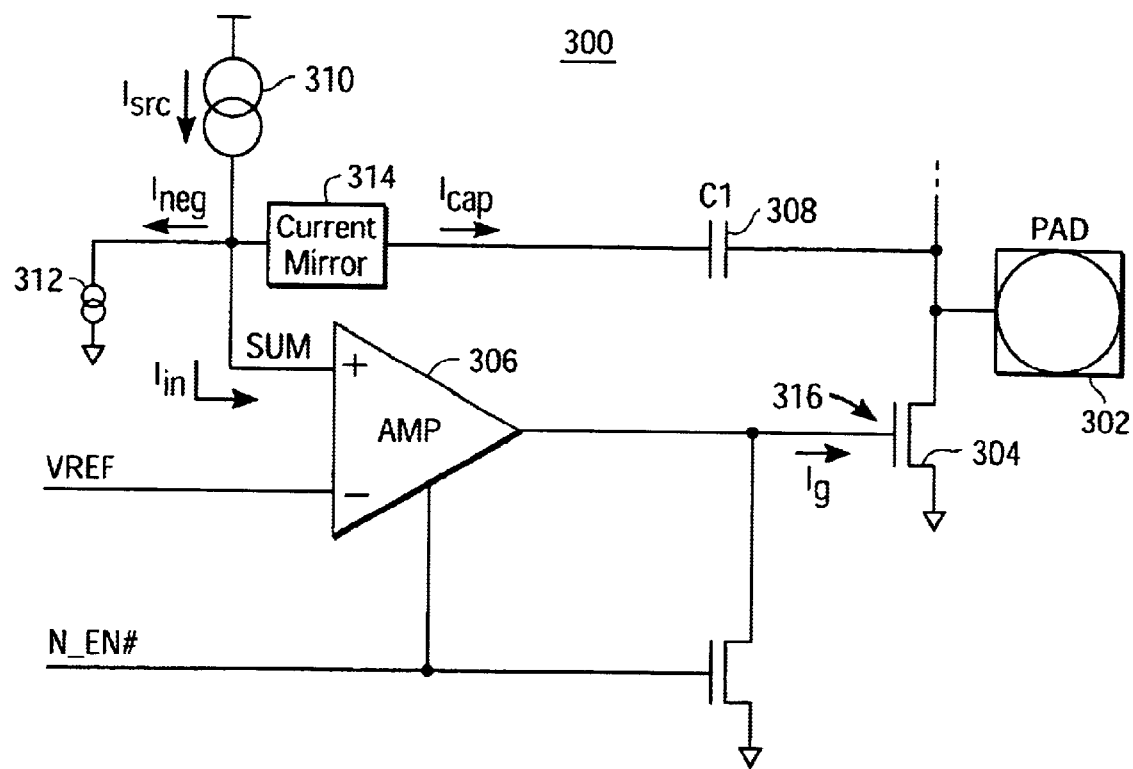
FIG. 3 illustrates a simplified schematic diagram of an embodiment the pull-down portion of an output buffer having slew rate control circuitry.

FIG. 3 illustrates a simplified schematic diagram of an embodiment the pull-down portion of an output buffer having transition rate control circuitry. In an embodiment, Buffer circuit 300 includes output pad 302, pull down transistor amplifier 304; feedback capacitor 308, current source 310, current sink 312, a current mirror 314, and/or other components. Referring to FIG. 3, each buffer circuit has an output driver transistor, such as pull-down transistors 304, has an amplifier 306, a feedback capacitor 308, current sources 310 and a current sink 312.

These components work together to force a controlled linear ramp on the buffers output pad 302. Amplifier 306 feedback capacitor 308, and current mirror 314 together control the fall time of output pad 302 through pull-down transistor 304. For example, if the buffer circuit 300 connects to a bus, then the amplifier 306, feedback capacitor 308, and current mirror 314 determine just how the bus transitions voltage from a high voltage state to a low voltage state. A voltage reference is established at approximately VREF. VREF is chosen for the convenience of the particular embodiment. The node SUM is held close to the voltage reference at all times by bias circuits (not shown in FIG. 3). The feedback current through feedback capacitor 308 on amplifier 306 acts to keep the sum terminal (SUM) close to the voltage reference. If the voltage value of SUM is above VREF, then the amplifier drives the gate 316 of pull-down transistor 304 higher. Conversely, if voltage value of SUM is lower than VREF, amplifier 306 drives the voltage on the gate 316 lower. The higher the voltage potential on the gate 316 increases the current from PAD 302 through driver transistor 304 to ground. This increases the magnitude of the edge rate on PAD 302. In an embodiment, the gate acts as the input terminal for driver amplifier referred to 85 pull-down transistor 304.

The transition rate of the buffer output signal is measured at output pad 302 and is sensed by the current ($i_{CAP}$) through feedback capacitor C1 308 as given in Equation (1):

$$i_{CAP}=C1dV/dT \qquad \text{Eq. (1)}$$

Feedback current flow through the capacitor equals the size of the capacitor multiplied by the change of voltage sensed by the capacitor over time. The expressions "slew rate" and "transition rate" are commonly used, and used herein, to refer to the rate of voltage change with respect to time. This is also referred to mathematically as dV/dT, the first derivative of a time varying voltage with respect to time.

Since the voltage on SUM does not change significantly, dV/dT across feedback capacitor C1 308 may approximately represent the rate of change (slope) of the voltage at output pad 302. When the current from the current source 310 ($i_{SRC}$) is greater than the current through feedback capacitor C1 308, then the difference in the currents raises the voltage of node SUM. In response, amplifier 306 drives the gate voltage of pull-down transistor 304 higher. The increased gate voltage increases the drive strength of pull-down transistor 304 and consequently the slope of the output pad 302 increases, which in turn increases $i_{CAP}$ until it equals $i_{SRC}$. If the current $i_{CAP}$ is greater than $i_{SRC}$, then SUM is discharged and amplifier 306 decreases the gate drive on pull-down transistor 304, reducing the driver's strength and the slope of the output transition and $i_{CAP}$, bringing $i_{CAP}$ and $i_{SRC}$ into balance.

In an embodiment, the values for the various components in the buffer 300 may depend upon the target slope of the output signal and the practical limits on the physical size of capacitors that can be manufactured in a given semiconductor process. In previously used technology, once the target slope and the value of capacitor C1 are chosen, the value of $i_{CAP}$ in the can be determined. However, in an embodiment, the current mirror 314 multiplies the value of $i_{CAP}$ to allow the value of C1 308 to be reduced.

In an embodiment, the target slope (i.e., dV/dT) of the output may be chosen by taking the magnitude of the change in voltage between, for example, 10% and 90% of the final output waveform swing, and dividing by the rise/fall time. For example, a 10–90 swing of 3.0 volts and a rise/fall time of 150 nanoseconds, gives a target slope of 20 V/μs in a 1.0 pF feedback capacitor in accordance with equation (1):

$i_{CAP}=C1dV/dT=(1.0 \text{ pF})(3V/150 \text{ ns})=1.0 \text{ pF } (20V/\text{microsecond})= 20 \text{ μA}$ In an embodiment, transition rate can be calculated in accordance with the following new equation, dV/dT=G*Ig/C. Transition rate equals Gain of the current mirror 314 times the gate current divided by the capacitance value of the feedback capacitor 308.

Thus, for example, using a current mirror with a gain of 8, the capacitor need draw only ⅛ of the total current previously needed to achieve the targeted transition rate. The feedback capacitor draws 2.5 μA at the desired transition rate. The current mirror draws 17.5 μA. The total current redirected from the pre-driver is still 20 μA as calculated in equation 1; however, the value of the capacitance of the feedback capacitor is 0.125 pF. The transition rate can be calculated in accordance with the following new equation:

$$dV/dT=G*Ig/C. \quad 3V/150 \text{ ns}=8*2.5 \text{ μA}0.125 \text{ pF} \qquad \text{Eq. (2)}$$

The physical size of the feedback capacitor 308 reduces significantly.

In an embodiment, a USB Low-Speed output buffer uses feedback capacitor C1 308 to control the rate at which the output pad 302 is charged. The current mirror 314 proportionately increases the controlling effect of the feedback capacitor 308.

In an embodiment, current sources 310 and current sink 312 supply bias current required by the amplifier 306. The two current sources 310 312 are used in the pre-driver circuit. The difference between the currents produced by these two sources is Idelta. The feedback capacitor C1 308 is connected between the pad and the pre-driver circuit.

When C1(dV/DT)=Idelta, iIN is zero. The voltage difference between SUM and the reference voltage is constant, because no charge is added to the SUM node (iIN is zero). The output of the amp 306 is constant because its inputs, the reference voltage and the SUM node, are constant. This fixes the gate voltage of output transistor 304, and thus fixes its drain current, thereby controlling the edge rate of PAD 302. Capacitor size is dictated by the required dV/dT and required minimum gate current (Ig) of the driver amplifier.

By adding the current mirror 314 between the C1 308 and the pre-driver circuit, the capacitor 308 may control more current then it may itself pass. If the current mirror with a gain greater than one is used, the feedback capacitor 308 may be made arbitrarily small 314 within limits of manufacturability. For example, a 4 pF Metal/insulator/metal capacitor in a buffer circuit may be about 13 mil×13 mil. A use of a current mirror 314 with a gain of eight would reduce that capacitor to 0.5 pF. This corresponds to a square 4.6 mils per side. Each implementation of a USB port may use two low-speed buffer circuits, each with it's own capacitor. Thus, the die area savings per USB is 2(13 mil)^2−2(4.6 mil^2=146 square mil per USB port.

Figure 4:
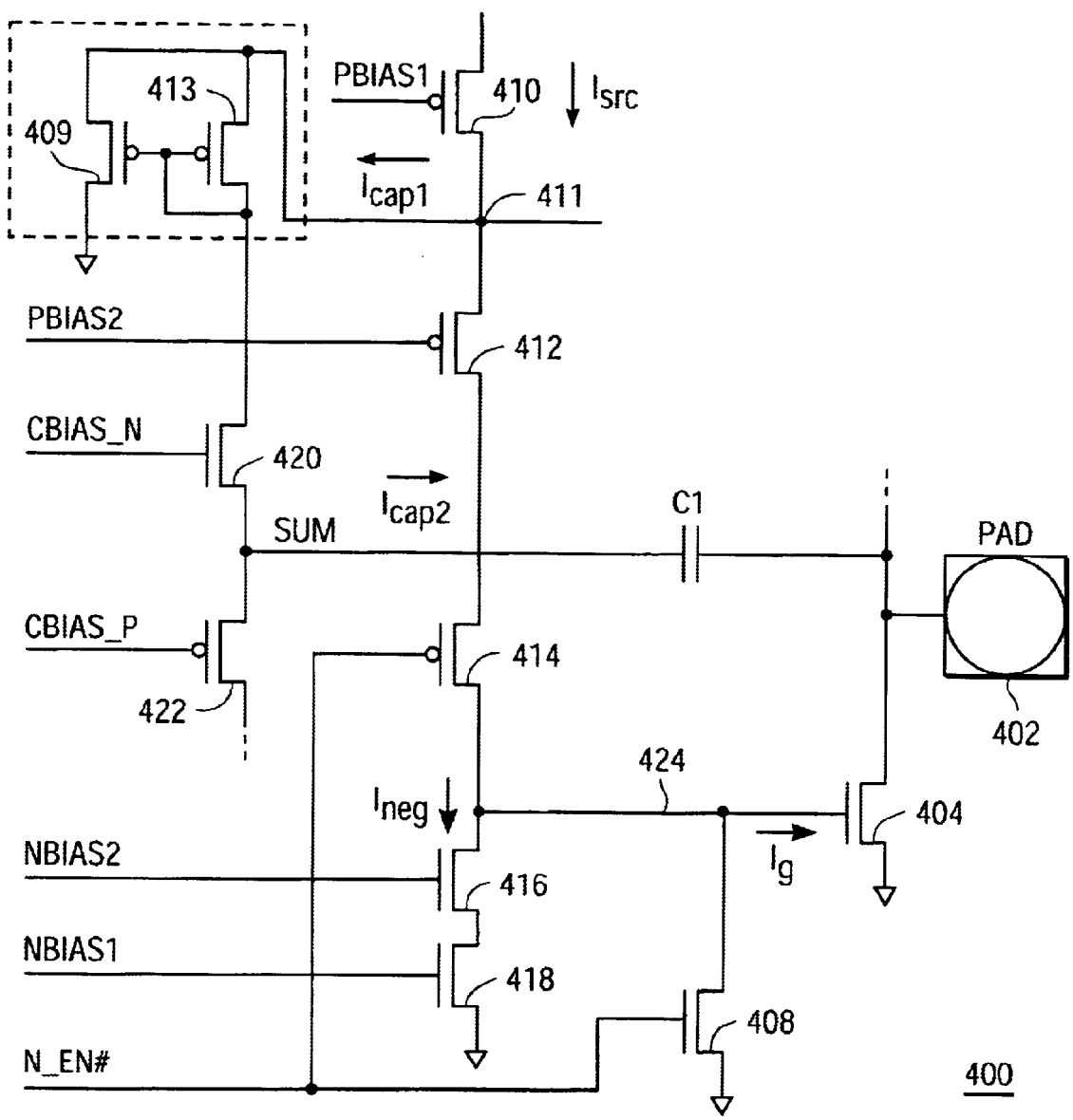
FIG. 4 illustrates an embodiment of a transistor level schematic diagram of another pull-down portion of an output buffer having slew rate control circuit.

FIG. 4 is an embodiment of a transistor level schematic diagram of another pull-down portion of an output buffer having slew rate control circuitry. Referring to FIG. 4, FET refers to a field effect transistor. NFET and PFET refer respectively to an n-channel FET and a p-channel FET both of which are voltage controlled devices. FETs are also referred to as MOS devices or MOSFETs.

PFET 410 maybe a current source for $i_{SRC.}$ controlled by voltage PBIAS1. PFET 410 sources for example, two units of current. The amplifier is a modified, folded cascode amplifier made up of NFETs 420, 418 and PFETs 412, 422. NFET 420 and PFET 412 are a current steering pair, NFETs 416, 418 make up the current sink for the amplifier. NFET 418 is controlled by voltage signal NBIAS1, and in this illustrative example, it sinks one unit of current. NFET 416 may act as a cascode for NFET 418. In an embodiment, having a positive current source and a negative current sink make the transition rate more linear throughout the entire transition range and reduces noise effects. In an embodiment, other types of current sources, with other current source or sink values or ratios, may be used as may be desired in other embodiments. The greater nominal levels of current flow minimize noise current effects and biasing the amplifier to constantly conduct allows the amplifier to operate in a linear range. NFET 416 acts as a cascode transistor to increase the effective output impedance of NFET 418, thus making its performance more like that of an ideal current source.

PFET 414 and NFET 408 act to enable the amplifier/pre-driver when N-EN# is low. NFET 404 is the output buffer pull-down transistor. Capacitor C1 provides feedback from output pad 402 to the input of the amplifier, which the node is labeled SUM in FIG. 4. In an embodiment CBIAS-N and CBIAS-P set node SUM to be at Vcc/2 when there is no transition in progress. NFET 420 and PFET 422 are both biased near cutoff. A change in the voltage at node SUM from Vcc/2 in the negative direction tends to turn on NFET 420. Similarly, a change in the voltage at node SUM from Vcc/2 in the positive direction tends to turn on PFET 422 for controlling positive transitions.

PFET 409 and PFET 413 form a current mirror. The gates of PFET 409 and PFET 413 are coupled together. The drain of PFET 413 is connected in series with feedback cap C 1. Thus, the feedback current passing through C 1 equals the current passing through PFET 413. The gate of PFET 409 is tied to the gate of PFET 413, and the source of PFET 409 is tied to the source of PFET 413, so that PFET 409 has the same gate and source voltages as does PFET 413, and so that PFET 409 may divert current from node 411. In an embodiment, multiple stages similar to PFET 409 connect to PFET 413 to increase the gain of the current mirror. In an embodiment, each additional PFET connects its source to the source of PFET 413. Additionally, each additional PFET connects its gate to the gate of PFET 413.

In an embodiment, the current mirror 409 413 may posses a variable programmable gain. In an embodiment, multiple stages similar to PFET 409 may be connected to PFET 413 in a similar manner. The gate of each new PFET is connected to the gate of PFET 413, and the source of each new PFET is connected to the source of PFET 413. The drain of each new PFET is connected to an NMOS switch. A logic may apply a voltage to one or more NMOS switches in order to individually turn on each NMOS switch. For each NMOS switch turned on a new PFET diverts additional current from node 411 and increases the gain of the current mirror. Logic may be electronic hardware or software or combination of both. Logic may follow Boolean Logic rules or analog principles.

Three main branches of current paths exist from the output 411 of PFET 410, (the current source (Isrc). A first current path (current sink path) exists to the current sink through PFET 412, PFET 414, NFET 416, and NFET 418. A second current path (gate current path) that passes charge to the gate of the pull-down driver transistor 404 that passes through PFET 412, PFET 414, and to the gate of pull-down transistor 404. The third current path exists for feedback (feedback current path) current through PFET 409, PFET 413, NFET 420, feedback capacitor C 1, and the source to the drain of pull-down transistor 404. The amount of current entering current node 411, for example two units of current, equals the total current leaving current node 411 through the three main branches of current paths. The folded cascode amplifier current steers $i_{SRC}$ through NFET 420 or PFET 412, depending on the value of $i_{CAP1}$.

In an embodiment, the buffer circuit 400 may produce a controlled falling edge rate. Assuming a starting point of operation, voltage at pad 402 is at a high level, and no current flows through capacitor C1. SUM is at approximately Vcc/2. With N-EN# high, the current through PFET 414 is cutoff and NFET 408 holds low the gate 424 of pull-down transistors 404, thus maintaining pull-down transistors 404 in a virtual non-conducting state. When N-EN# goes low, current can flow through the first current path and gate 424 can charge up. With NFET 420 off, approximately all of the current from PFET 410 (i.e., 2 units) flows through the gate current path and the current sink path. NFETs 416, 418 draw one unit of current away from PFET 410 gate leaving a net of 1 unit of current to charge up gate 424.

When the voltage on node 424 crosses the threshold voltage of the driver transistor, pull-down NFET 404, current begins to flow between pad 402 and ground through NFET 404. This starts a negative transition on pad 402. As the voltage at pad 402 starts to decrease, $i_{CAP2}$ begins to flow through capacitor C1. In an embodiment, the feedback current through capacitor C1 corresponds to equation (2). This current flow results in a lower voltage at SUM, consequently turning on NFET 420. As soon as NFET 420 is on, SUM does not go much lower and approximately all of $i_{CAP1}$ conducts through NFET 420 and the current mirror pair 409 413. NFET 420 and the current mirror pair 409 413 drain this current from node 411, reducing the current going through PFET 412 to gate 424. The current mirror pair 409 413 multiply the amount current diverted from node 411 in proportion to the current flowing through the feedback capacitor. In an embodiment, when the slope of the signal at pad 402 is sufficient that $i_{CAP2}$ is one unit (i.e., slope =target slope), then NFET 420 is conducting one unit, leaving only one unit to flow through PFET 412 into gate 424. However, since NFETs 416, 418 sink one unit of current, no net current enters into gate 424. The gate voltage on pull-down transistor 404 stabilizes, thus fixing the transition rate at output pad 402.

If the slope of the signal at pad 402 exceeds the target slope, then $i_{CAP2}$ is greater than one unit and the current through PFET 412 becomes less than one unit. This means that the net current flow into gate 424 is negative and the gate voltage on pull-down transistor 404 decreases, acting to reduce the transition slope at pad 402. This current balancing continues until the voltage at pad 402 reaches ground. At this point, the slope is forced to be zero again. No $i_{CAP1}$ flows and all the current from PFET 410 goes to gate 424. Gate 424 starts charging again and eventually reaches substantially the voltage of Vcc.

In an embodiment, the value of capacitor C1 may be limited by practical considerations such as the processing steps available in standard logic CMOS technologies to manufacture capacitors. In an embodiment, the buffer circuit reduces the cost of manufacturing Universal Serial Bus (USB) Low-Speed output circuits by reducing the size of the feedback capacitor in the USB Low Speed output circuit.

Figure 5:
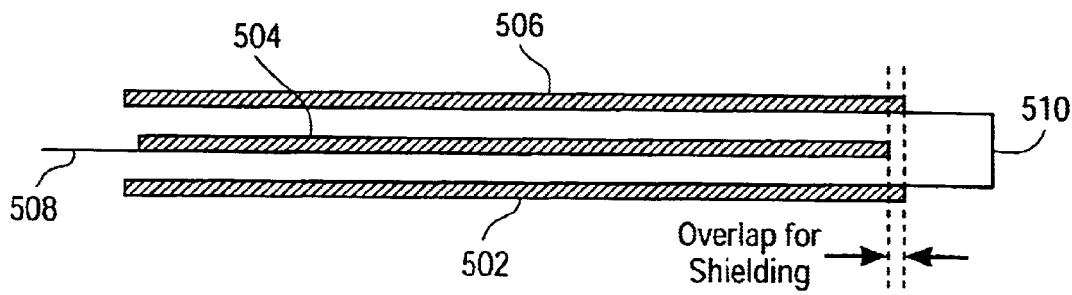
FIG. 5 illustrates an embodiment of a cross-sectional view of a folded capacitor.

FIG. 5 is a cross-sectional view of a folded capacitor that may be used as a feedback capacitor. In an embodiment, the feedback capacitor can be practically manufactured as a poly-metal1-metal2 sandwich. A layer of poly 502 is electrically coupled to a layer of metal 506 to form one terminal of a folded capacitor. A metal layer 504 forms the second terminal. Poly 502 and metal 504 are 30 separated by an interlayer dielectric. Similarly, metal 504 and metal 506 are separated by an interlayer dielectric. In an embodiment, CMOS logic processes can make a feedback capacitor up to approximately one picofarad. In an embodiment, the capacitor should be laid out as square as possible to reduce process variations and noise pick-up. Additionally, overlapping the center plate with the outer plates and keeping other signals away from the center plate reduces crosstalk to the node connected to the center plate. It is well understood by those skilled in the art that the practical values for the capacitors will vary with changes in semiconductor manufacturing processes. In an embodiment, Metal-to-metal capacitors are generally voltage-invariant may be used instead of voltage variable gate capacitors. In an embodiment, a "folded capacitor" may refer to a capacitor structure in which the plates of the capacitor and the insulating dielectric are interleaved, or stacked, so as to provide a given plate area with a smaller footprint. In an embodiment, Poly may refer to polycrystalline silicon or polysilicon or a similar substance.

Figure 6:
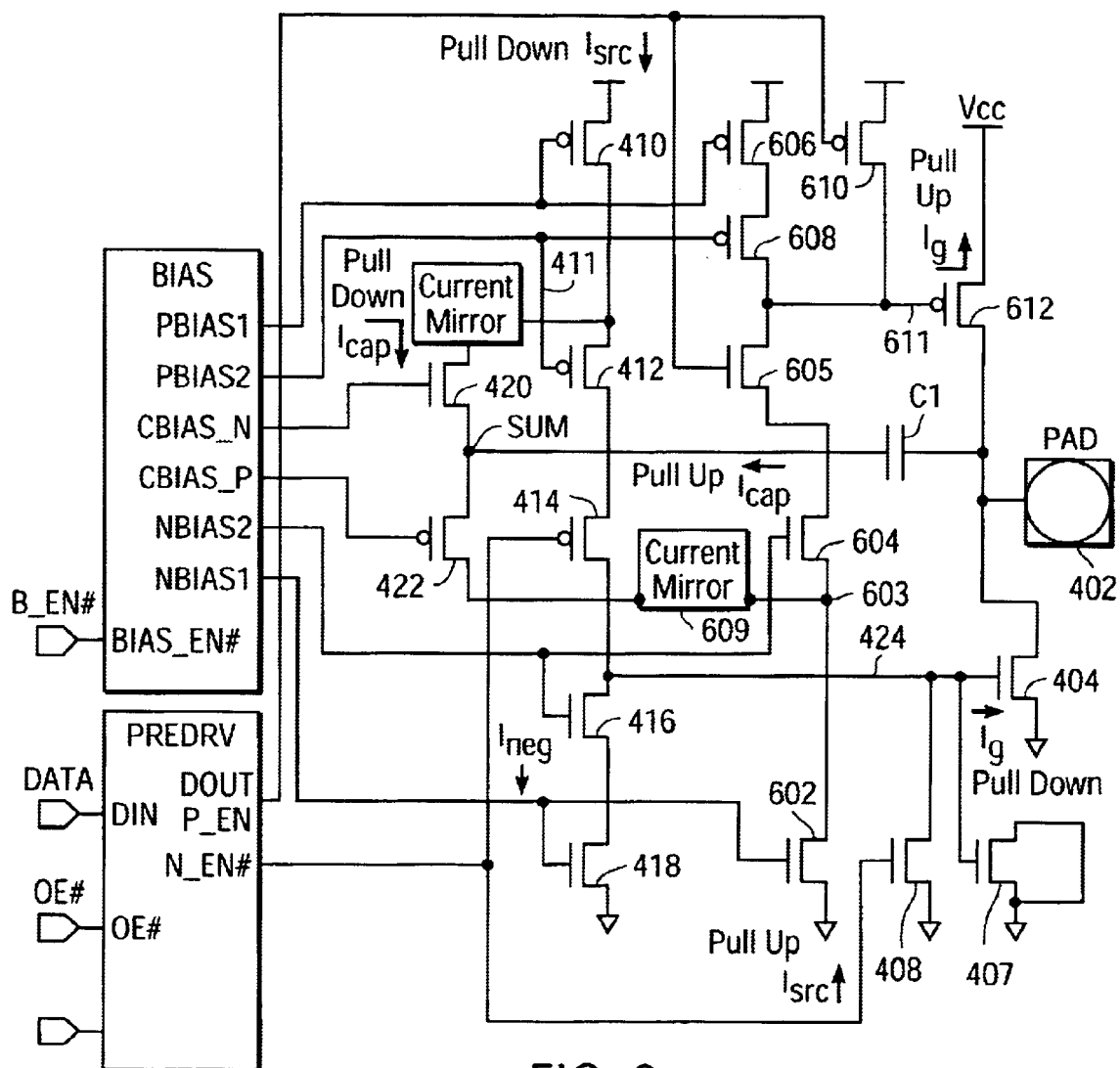
FIG. 6 illustrates an embodiment of schematic of a slew rate output buffer consisting of both the pull-up and pull-down drivers.

FIG. 6 illustrates an embodiment of schematic of an output buffer with slew-rate control, showing both the pull-up and pull down drivers. The slew rate output buffer controls impedance of the output stage to obtain a predetermined rate of change of voltage at the output stage through use of capacitive feedback between the output stage and a pre-driver circuit. The slew decreases or pulls-down the voltage on the output pad as well as pulls up or increases the voltage at the output pad. The pull-down circuitry operates in a similar manner as described in FIG. 4.

Referring to FIG. 6, the positive transition at pad 402 may be controlled in the same manner using a second driver amplifier and pre-driver circuit including associated current sources. For the pull-up circuitry, $i_{SRC}$ current is supplied by NFET 602 to node 603. The pull-up source current similarly flows through three main branches of current paths. The pull-up feedback current path through current mirror 609, pre-driver PFET 422, feedback capacitor C1, and source to drain of pull-up driver PFET 612. The current sink path through PFETs 606, 608. Lastly, the pull-up gate current path through NFETs 604, 605 and then gate 611 to drain of pull-up driver PFET 612.

The modified, folded cascode amplifier has two current steering devices, PFET 422 and NFET 604, and two current load devices, PFETs 606, 608. NFET 605 and PFET 610 are used to enable and disable pull-up PFET 612. The gates of NFET 605 and PFET 610 are coupled in common to signal P-EN. Feedback current $i_{CAP}$ from pad 402 to node SUM is shared with the falling edge control circuits through capacitor C 1. NFET 407 may be sized to be the difference in size between NFET 404 and PFET 612 such that the capacitance on the gate 424 of pull down transistor NFET 404 and the capacitance on the gate 611 of pull-up transistor PFET 612 are substantially the same.

In an embodiment, the feedback paths for the pull-up and pull-down pre-drivers are effectively decoupled and can therefore be individually optimized. The pull-up current mirror 609 may possess a different gain multiplier than the pull-down current mirror 411. For example, pull-up current mirror 609 may consist of multiple stages NFETs coupled for a gain of eight. Pull-down current mirror 411 may consist of two stages of PFETs coupled together for a gain of two. Thus, the same slew rate output buffer 600 may have a first predetermined rate of change of voltage at the output pad 402 for pulling up the voltage on the output pad 402 and a second predetermined rate of change of voltage at the output pad 402 for pulling down voltage on the output pad 402. According to equation 2, in this example, the same feedback current though feedback capacitor C1 causes a slope four times greater for the pull-up transition than the pull-down transition.

In an embodiment, transistor matching may be used for transistors and the current mirrors in bias circuit. The other devices (except the output buffer transistors) can be sized using the minimum length and a moderate width (e.g., 10 $\mu$m to 20 $\mu$m in a 1.2 $\mu$m process). The width for NFETs and PFETs may be ratioed such that they have about the same drive strength for equivalent operating conditions. Output buffer transistor sizing may follow design rules for channel length and increments of channel width.

Matched FETs may be laid out in identical fashion. If the FET has to be two times or five times bigger than other devices, it may be made from two or five substantially identical FETs coupled in parallel, not from a single FET with a larger gate width. Also, matched FETs may be laid out in the same orientation as each other. Matched devices may share the same power supply rails to reduce or eliminate any offset voltage between the sources of the reference and current mirror devices.

There are second order effects to be considered if matching of the timing of rising and falling edges is desired. The capacitance of the internal nodes causes some loss of efficiency. Node 611 and node 424 may be matched to ensure that their capacitive loading and coupling from pad 402 are appropriately matched. Also, the biasing on PFET 422 and NFET 420 may be set so that when an edge is in progress, the current steering transistor not in use, such as NFET 420 for rising edges and PFET 422 for falling edges, is not conducting current. Any significant current lost at this time will slow down the affected edge.

In an embodiment, selection of the size of the feedback capacitor may set the unit currents. Larger currents make the design more noise resistant and require a smaller area of resistors, but require larger capacitors. Also, higher currents make the bandwidth of the amplifier higher and tend to make the circuit less damped.

The current mirror may be used in virtually any electronic circuit to reduce the physical size of capacitor. The above USB circuit just illustrates one implementation of an embodiment of the current mirror.

While some specific embodiments of the invention have been shown the invention is not to be limited to these embodiments. One skilled in the art will recognize that the current mirror may consists of an entire circuit rather than a couple transistors designed to multiply the feedback current effects on the input of the driver amplifier. The driver amplifier may consist of stages of amplifiers coupled to a common output pad rather than a single driver amplifier. The buffer circuit design may be altered or values of the components varied and still accomplish a similar function. The invention is to be understood as not limited by the specific embodiments described herein, but only by scope of the appended claims.

What is claimed is:

1. An apparatus comprising:
a buffer circuit to control the transition rate on an output pad of the buffer circuit;
a first amplifier having an input terminal and an output terminal, the output terminal coupled to the output pad;
feedback component to couple feedback current from the output pad to the input terminal; and
current mirror to multiply effects of the feedback current on the input terminal without increasing the feedback current through the feedback component.

2. The apparatus of claim 1, wherein the feedback component comprises a capacitor.

3. The apparatus of claim 1, wherein the current mirror comprises a second amplifier electrically connected to conduct a first current directly proportional to the feedback current.

4. The apparatus of claim 1, wherein the current mirror comprises
- a second amplifier having a first source terminal, a first drain terminal and a first gate terminal; and
- a third amplifier having a second source terminal, a second drain terminal and a second gate terminal, the first gate terminal and the second gate terminal are electrically connected, and the first drain couples to the feedback component.

5. The apparatus of claim 2, wherein the capacitor is a folded capacitor.

6. The apparatus of claim 1, wherein the apparatus comprises a Universal Serial Bus low-speed output circuit.

7. The apparatus of claim 1, wherein the current mirror possess a gain greater than one.

8. A controlled slew rate buffer circuit, comprising:
- a capacitor coupled between an output terminal of the buffer circuit and a input terminal of a first driver amplifier; and
- a first current mirror coupled to the capacitor and between the input terminal and the output terminal.

9. The buffer circuit of claim 8, wherein the first current mirror to increase feedback current at the input terminal independent of increasing the actual current flowing through the capacitor.

10. The buffer circuit of claim 8, further comprising:
- a second driver amplifier to pull-up voltage level on the output terminal, a second current mirror possessing a first gain, the second current mirror couples to the second driver; and
- the first driver amplifier to pull-down voltage level on the output terminal, the first current mirror possessing a second gain, the second gain having a different value than the first gain.

11. The buffer circuit of claim 8, wherein the buffer circuit comprises a Universal Serial Bus low-speed output circuit.

12. The buffer circuit of claim 8, further comprising:
- a pre-driver amplifier coupled to the capacitor and the first driver amplifier.

13. The buffer circuit of claim 8, further comprising:
- pull-up circuitry to generate a first slew rate at the output terminal for pulling up the voltage on the output terminal; and
- pull-down circuitry to generate a second slew rate at the output terminal for pulling down the voltage on the output terminal.

14. A method, comprising:
- controlling impedance of an output stage to obtain a predetermined rate of change of voltage at the output stage through use of capacitive feedback between the output stage and a pre-driver circuit; and
- mirroring current flow through the capacitive feedback and then multiplying the mirrored current flow.

15. The method of claim 14, further comprising:
- multiplying effects of the capacitive feedback on the pre-driver circuit in order to decrease a capacitance value of a feedback capacitor used to achieve the predetermined rate of change of voltage.

16. The method of claim 14, further comprising:
- generating a first slope for the predetermined rate of change of voltage at the output stage for pulling up voltage on the output stage; and
- generating a second slope for the predetermined rate of change of voltage at the output stage for pulling down voltage on the output stage, the second slope having a different value than the first slope.

17. An apparatus, comprising:
- means for controlling impedance of an output stage to obtain a predetermined rate of change of voltage at the output stage through use of capacitive feedback between the output stage and a pre-driver circuit; and
- means for mirroring current flow through the capacitive feedback and then multiplying the mirrored current flow.

18. The apparatus of claim 17, further comprising:
- means for multiplying effects of the capacitive feedback on the pre-driver circuit in order to decrease a capacitance value of a feedback capacitor used to achieve the predetermined rate of change of voltage.

19. The apparatus of claim 17, further comprising:
- means for generating a first slope for the predetermined rate of change of voltage at the output stage for pulling up voltage on the output stage; and
- means for generating a second slope for the predetermined rate of change of voltage at the output stage for pulling down voltage on the output stage, the second slope having a different value than the first slope.

20. An apparatus, comprising:
- an impedance controller to obtain a predetermined rate of change of voltage at an output stage through use of capacitive feedback between the output stage and a pre-driver circuit; and
- a current mirror to multiply the effects of the capacitive feedback on the pre-driver circuit in order to decrease a capacitance value of a feedback capacitor used to achieve the predetermined rate of change of voltage.

21. The apparatus of claim 20, further comprising:
- a first driver amplifier to generate a first slope for the predetermined rate of change of voltage at the output stage for pulling up voltage on the output stage; and
- a second driver amplifier to generate a second slope for the predetermined rate of change of voltage at the output stage for pulling down voltage on the output stage, the second slope having a different value than the first slope.

22. The apparatus of claim 20, wherein the current mirror further comprises a programmable variable gain current mirror.

* * * * *

UNITED STATES PATENT AND TRADEMARK OFFICE
CERTIFICATE OF CORRECTION

PATENT NO. : 6,731,164 B2
DATED : May 4, 2004
INVENTOR(S) : Johnston

It is certified that error appears in the above-identified patent and that said Letters Patent is hereby corrected as shown below:

Column 3,
Line 17, delete "85" and insert -- as --.

Column 4,
Line 13, delete "$\mu$A0.125" and insert -- $\mu$A/.125 --.

Column 5,
Line 51, delete "lsrc" and insert -- (Isrc) --.

Signed and Sealed this

Thirtieth Day of November, 2004

JON W. DUDAS
*Director of the United States Patent and Trademark Office*